United States Patent [19]

Gill et al.

[11] 4,275,360
[45] Jun. 23, 1981

[54] ELECTRONIC AMPLIFIER CIRCUIT ARRANGEMENTS

[75] Inventors: Kenneth E. Gill, Yateley; Anthony E. Hilling, Guildford, both of England

[73] Assignee: Racal Communications Equipment, Berkshire, England

[21] Appl. No.: 24,972

[22] Filed: Mar. 29, 1979

[30] Foreign Application Priority Data

Mar. 29, 1978 [GB] United Kingdom ............... 12181/78

[51] Int. Cl.³ ............................................. H03F 3/26
[52] U.S. Cl. .................................................. 330/276
[58] Field of Search ................ 330/122, 188, 189, 276

[56] References Cited

U.S. PATENT DOCUMENTS

| | | | |
|---|---|---|---|
| 2,808,469 | 10/1957 | Crow et al. | 330/276 |
| 3,388,337 | 6/1968 | Lee et al. | 330/189 X |
| 3,652,947 | 3/1972 | Hollingsworth | 330/276 |
| 3,652,948 | 3/1972 | Fierstien et al. | 330/276 |

*Primary Examiner*—James B. Mullins

[57] ABSTRACT

A push-pull amplifier arrangement for driving a radio transmitter is shown. It comprises two high power transistors connected in push-pull through the primary winding of an output transformer. The base-emitter circuit of each transistor has a separate and independent input drive circuit each comprising a respective frequency-dependent impedance circuit and a respective transformer. The transistors are biased to operate in Class AB. The use of completely independent drive circuits reduces distortion and this effect is assisted by the frequency-dependent impedance circuits.

3 Claims, 1 Drawing Figure

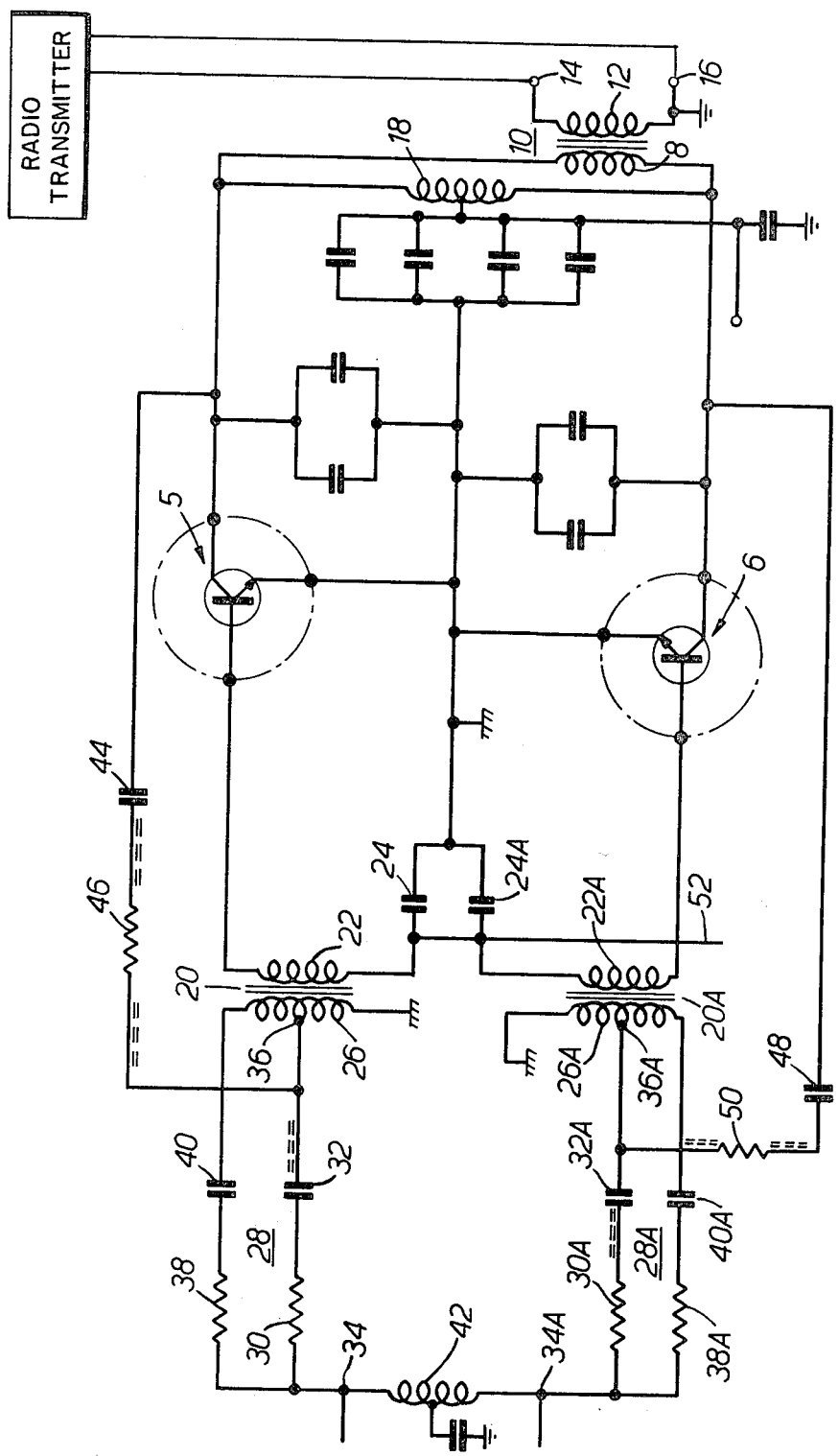

ELECTRONIC AMPLIFIER CIRCUIT ARRANGEMENTS

BACKGROUND OF THE INVENTION

This invention relates to electronic circuits and more specifically to high power electronic amplifier circuit arrangements such as used in a single side band radio transmitter.

In a more specific sense the invention applies to an amplifier circuit arrangement, comprising two amplifier devices connected together to provide a push pull output and biased so as to operate in Class AB or B.

It is known to use push-pull transistorised amplifiers where high output power is required, such as for example, when used in a radio transmitter. In many applications (particularly when used in radio transmitters) it is essential that distortion in the output be reduced to a minimum. With known forms of push-pull amplifier circuits, however, distortion can be created in the amplifier because the transistor which is for the time being conducting drives current through the other transistor (which is nominally OFF) and this latter current produces distortion.

BRIEF SUMMARY OF THE INVENTION

According to the invention, there is provided an amplifier circuit arrangement, comprising two amplifier devices connected together to provide a push-pull output and biased so as to operate in one of Classes AB and B, each amplifier device having a respective and separately transformer-coupled driving circuit such that when an input current is applied to one of the amplifier devices through its respective driving circuit substantially none of the current is applied to the other amplifier device.

DESCRIPTION OF THE DRAWING

A high power electronic amplifier circuit arrangement embodying the invention will now be described, by way of example, with reference to the accompanying drawing which is a schematic circuit diagram of the arrangement.

DESCRIPTION OF PREFERRED EMBODIMENTS

As shown, the circuit arrangement comprises two high power transistors 5 and 6 having their collector circuits connected together to provide a push-pull output through the primary winding 8 of an output transformer 10 having a secondary winding 12 which is connected across output terminals 14 and 16. The collectors of the two transistors are also connected together through the winding 18 of a balancing transformer.

The base-emitter circuit of each of the transistors 5 and 6 is connected to be separately driven by the input signal to be amplified. For this purpose, each transistor has a separate and independent input drive circuit.

Thus, transistor 5 has an input transformer 20 with its secondary winding 22 connected between base and emitter of transistor 5 through a capacitor 24. Its primary winding 26 is connected to be energised by the input signal via an input circuit 28.

In this example, the input circuit comprises two parallel-connected arms. One arm comprises a resistor 30, a relatively high value capacitor 32 and a ferrite bead, and is connected from an input terminal 34 to a tapping point 36 on the primary winding 26. The other arm comprises a resistor 38 and a relatively low value capacitor 40 and is connected between the input terminal 34 and the end of the winding 26.

The base-emitter circuit of the other transistor, transistor 6, is connected to be energised by a similar but electrically separate input circuit, and the parts of this input circuit are referenced similarly to the corresponding parts of the input circuit for transistor 5, except for the addition of suffix "A".

The input signal to be amplified is applied in antiphase to the terminals 34 and 34A, for example by means of an input winding 42.

Each transistor 5 and 6 has a respective negative feedback path via a capacitor 44, ferrite beads and a resistor 46 in the case of transistor 5 and via a capcitor 48, ferrite beads and a resistor 50 in the case of transistor 6.

For biasing the transistors 5 and 6, a bias line 52 is provided which is connected to a d.c. source not shown.

In operation, the bais source is adjusted so as to bias each transistor 5, 6, to operate in Class AB, in order to provide high efficiency. By providing each transistor with a substantially independent driving circuit (and, in particular, a separate driving transformer), it is found that distortion is very substantially reduced. This is mainly because each input circuit, being substantially separate from the other, energises only (or substantially only) its respective transistor, and, in contrast to what would apply if the two transistors had a common driving transformer, feeds substantially no current through the other transistor (that is, the transistor that is OFF). By substantially eliminating the latter current, the distortion which it causes is also eliminated.

It is also found that the two impedance circuits 28 and 28A are important in assisting in reducing distortion. In the particular example shown, each input circuit is frequency-dependent. This is advantageous because the input impedance of the transistors varies with frequency, increasing (in one example) from about 1 ohm at 30 MHz, to, say, 5 ohms at 2 MHz. The frequency dependence of the input circuit tends to compensate for this.

Circuit arrangements constructed in the manner illustrated are particularly advantageous for use in single side band radio transmitters. They have been found to produce very low intermodulation distortion, better than −35dB relative to one tone of a two tone signal (each tone being of equal amplitude).

What is claimed is:

1. An amplifier circuit arrangement, comprising
  two matched power transistors connected together to provide a push-pull output and biased so as to operate in Class AB, and
  a respective and separate transformer-coupled driving circuit connected to drive each transistor such that when an input current is applied to one of the transistors through its respective driving circuit substantially none of the current is applied to the other transistor,
  each driving circuit comprising a respective transformer and a respective input circuit connected to energise the primary winding of the transformer with an input current whereby the secondary winding of the transformer applies a corresponding current to the respective transistor, each input circuit comprising two parallel-connected input paths for the input current and each connected to a respective point on the primary winding of the respective transformer, one said input path having an impedance which increases with frequency and being connected to drive the input current through a smaller part of the primary winding than the other input path which has an impedance which decreases with increasing frequency, so as to alter the effective turns ratio of the transformer as the frequency increases and thereby to compensate for the decrease in impedance of the respective transistor as the frequency increases.

2. An arrangement according to claim 1, including an input winding across which the said input signal is applied and which is connected to the two input circuits whereby the primary winding of one said transformer is connected to receive, in anti-phase with the primary winding of the other transformer, the input signal to be amplified.

3. In combination, a radio transmitter and a high-power amplifying circuit arrangement, the said high-power amplifying circuit arrangement comprising two high-power matched transistors having their outputs connected in push-pull and each biased to operate in Class AB, two input transformers each having respective primary and secondary windings which are inductively separate from the primary and secondary windings of the other, means connecting each transistor to be energised by the secondary winding of a respective one of the two transformers, a respective input circuit connecting the primary winding of each transformer to receive, in anti-phase to the primary winding of the other transformer, the input current to be amplified each input circuit comprising first and second parallel-connected input paths the first of which is connected to feed the input current through a substantially lesser part of the corresponding primary winding than the second one, each first path comprising a series-connected resistor, capacitor and inductance and each second path comprising a series-connected resistor and capacitor, whereby the impedance of each first path to the input current increases with increasing frequency and thus diverts more of the input current into the respective second path so as to change the effective turns ratio of the respective transformer and compensate for the decrease in impedance of the respective transistor as the frequency increases, and including an output transformer having a primary winding connected to be energised by the output of the two transistors and a secondary winding connected to drive the said transmitter.

* * * * *